(12) United States Patent
Cai et al.

(10) Patent No.: US 8,829,424 B2
(45) Date of Patent: Sep. 9, 2014

(54) METHOD AND APPARATUS FOR MONITORING ELECTRON BEAM CONDITION OF SCANNING ELECTRON MICROSCOPE

(71) Applicants: BoXiu Cai, Shanghai (CN); Yi Huang, Shanghai (CN)

(72) Inventors: BoXiu Cai, Shanghai (CN); Yi Huang, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/756,148

(22) Filed: Jan. 31, 2013

(65) Prior Publication Data

US 2014/0117218 A1  May 1, 2014

(30) Foreign Application Priority Data

Oct. 31, 2012 (CN) .......................... 2012 1 0427489

(51) Int. Cl.
*G01D 18/00* (2006.01)
*H01J 37/26* (2006.01)

(52) U.S. Cl.
CPC .................................. *H01J 37/265* (2013.01)
USPC .................................................... 250/252.1

(58) Field of Classification Search
USPC ..................................................... 250/252.1
See application file for complete search history.

(56) References Cited

U.S. PATENT DOCUMENTS

| | | | | |
|---|---|---|---|---|
| 5,519,216 A * | 5/1996 | Benner et al. | ................. | 250/311 |
| 6,884,992 B1 * | 4/2005 | Heiland | ....................... | 250/234 |
| 7,075,098 B2 * | 7/2006 | Ikeda et al. | ................. | 250/559.3 |
| 7,580,590 B2 * | 8/2009 | Lin et al. | ....................... | 382/286 |
| 2002/0134936 A1 * | 9/2002 | Matsui et al. | ................... | 250/310 |
| 2005/0040331 A1 * | 2/2005 | Gunji et al. | ................... | 250/310 |
| 2005/0043903 A1 * | 2/2005 | Nara et al. | ...................... | 702/35 |
| 2006/0091309 A1 * | 5/2006 | Oosaki et al. | ................. | 250/310 |
| 2006/0255272 A1 * | 11/2006 | Nakayama et al. | .......... | 250/310 |
| 2007/0284526 A1 * | 12/2007 | Nara et al. | ..................... | 250/307 |
| 2008/0198467 A1 * | 8/2008 | Nakayama | .................... | 359/569 |
| 2008/0260106 A1 * | 10/2008 | Davilla | ........................ | 378/207 |
| 2009/0242794 A1 * | 10/2009 | Inada et al. | ............. | 250/440.11 |
| 2011/0178785 A1 * | 7/2011 | Tinnemans et al. | .............. | 703/2 |
| 2011/0205510 A1 * | 8/2011 | Menchtchikov et al. | ....... | 355/53 |

OTHER PUBLICATIONS

McCaffrey et al, "A transmission electron microscope (TEM) calibration standard sample for all magnification, camera constant, and image/diffraction pattern rotation calibrations", Microscopy Research and Technique 32, 1995, pp. 449-454.*

* cited by examiner

*Primary Examiner* — Kiho Kim
(74) *Attorney, Agent, or Firm* — Innovation Counsel LLP

(57) ABSTRACT

A method and an apparatus for monitoring an electron beam condition of an SEM are provided. The SEM includes an electron gun and an electromagnetic lens system. The method includes acquiring quality parameters of an input electron beam, wherein the input electron beam is provided by the electron gun to the electromagnetic lens system, acquiring a current set of operation parameters of the electromagnetic lens system, calculating quality parameters of an output electron beam of the electromagnetic lens system, based on the quality parameters of the input electron beam and one or more operation parameters of the current set of operation parameters, and determining, based on the quality parameters of the output electron beam, whether calibration of the SEM is required.

20 Claims, 3 Drawing Sheets

METHOD AND APPARATUS FOR MONITORING ELECTRON BEAM CONDITION OF SCANNING ELECTRON MICROSCOPE

CROSS-REFERENCE TO RELATED APPLICATIONS

This application claims priority under 35 U.S.C. §119 to Chinese Patent Application No. 201210427489.1, filed on Oct. 31, 2012 and entitled "Method and Apparatus for Monitoring Electron Beam Condition of Scanning Electron Microscope", which is incorporated herein by reference in its entirety.

BACKGROUND

1. Field of the Invention

The present disclosure relates to a scanning electron microscope (SEM), and more specifically, to a method and apparatus for monitoring electron beam condition of the SEM.

2. Description of the Related Art

SEM is widely used in various fields. For example, SEM can be used to detect wafer defects and measure critical dimensions in semiconductor manufacturing processing. Advantages of SEM include simple sample preparation, wide range of adjustable magnification, high image resolution, and large depth of field.

SEM operates using an electron beam to scan a surface of a sample in order to obtain information about the sample. The information may include surface structure, as well as physical and chemical properties of the sample. The SEM may include an electron beam system for producing the electron beam to scan the surface of the sample. The electron beam system may include an electron gun and an electromagnetic lens system. The electron gun is used to generate electrons. The electromagnetic lens systems may include a series of electromagnetic lenses for converging electrons emitted from the electron gun into an electron beam, and for focusing the electron beam onto the surface of the sample. Generally, it is preferable that the cross-section of the electron beam be relatively small and oval, so as to obtain a high image resolution during the scan.

In practice, the condition of the electron beam incident on the surface of the sample (hereinafter referred to "electron beam condition") may be affected by various factors, such as drift in the positions of the electron gun or the lenses in the electromagnetic lens system, instability in the operating voltage of the SEM, or mechanical positioning of the sample stage. As a result of one or more of the above factors, the electron beam condition may become unstable and may vary over time, thereby impacting SEM imaging quality. For simplicity, when "electron beam condition" is referenced hereinafter, it refers to the condition of the electron beam incident on the sample surface. The above problem is not uncommon in SEM imaging applications for advanced semiconductor technologies, since resolution of the decreased node dimensions and feature sizes is highly dependent on the electron beam condition.

In order to maintain the electron beam condition, offline calibrations may be performed periodically on the SEM at a fixed schedule, for example, after every 10 to 12 hours of SEM operation. When performing an offline calibration, the SEM is calibrated by measuring a standard sample with known parameters, and adjusting the settings in the SEM based on the known parameters so as to maintain the electron beam condition.

Typically, offline calibrations of the SEM are performed periodically independent of the electron beam condition. In other words, offline calibrations of the SEM may be performed even if there has been no deterioration in the electron beam condition and no calibration is necessary. As a result, periodic offline calibrations can lead to unnecessary and additional down-time of the SEM, since the SEM has to switch from operation (or production) mode to an offline state during offline calibrations.

In addition, periodic offline calibrations do not allow the electron beam condition of the SEM to be monitored continuously. As a result, offline calibrations alone may be insufficient to maintain the electron beam condition at all times during operation of the SEM. For example, the electron beam condition may deteriorate during the time interval between offline calibrations (while the SEM is still operating), and the problem may not be detected or corrected until the next offline calibration is performed.

To mitigate the above problem, the time interval between offline calibrations may be reduced. However, this will increase the frequency of offline calibrations (and corresponding SEM down-time), which may disrupt SEM operation and result in a loss in SEM scanning productivity. Furthermore, offline calibrations may yield a slightly different electron beam condition after each offline calibration, and the slight differences in electron beam condition may lead to inconsistencies in the results of sample measurements.

SUMMARY

The present disclosure is directed to solve at least the above problems in the prior art.

According to an embodiment of the inventive concept, a method for monitoring an electron beam condition of an SEM is provided. The SEM includes an electron gun and an electromagnetic lens system. The method includes acquiring quality parameters of an input electron beam, wherein the input electron beam is provided by the electron gun to the electromagnetic lens system. The method further includes acquiring a current set of operation parameters of the electromagnetic lens system, calculating quality parameters of an output electron beam of the electromagnetic lens system based on the quality parameters of the input electron beam and one or more operation parameters of the current set of operation parameters, and determining, based on the quality parameters of the output electron beam, whether calibration of the SEM is required.

According to some embodiments, the quality parameters of the input electron beam may include spatial-angular distribution, kinetic energy dispersion, or current amplitude of the input electron beam, and the quality parameters of the output electron beam may include a diameter, ovality, or collimation degree of the output electron beam.

According to some embodiments, acquiring the quality parameters of the input electron beam may include retrieving the quality parameters of the input electron beam from a data log of the electron gun.

According to some embodiments, acquiring the current set of operation parameters of the electromagnetic lens system may include retrieving the current set of operation parameters of the electromagnetic lens system from a data log of the electromagnetic lens system.

According to some embodiments, calculating the quality parameters of the output electron beam of the electromagnetic lens system may include calculating a transmission matrix of the electromagnetic lens system for the input electron beam using the current set of operation parameters and a transmission function of the electromagnetic lens system, and calculating the quality parameters of the output electron beam based on the quality parameters of the input electron beam and the transmission matrix.

According to some embodiments, the transmission function may be a matrix comprising a plurality of elements, and each element may be a function of one or more operation parameters of the current set of operation parameters.

According to some embodiments, the transmission function may be calculated by performing a series of imaging for one or more samples having known standard patterns using the SEM, acquiring quality parameters of the input electron beam and a set of operation parameters of the electromagnetic lens system for each imaging, obtaining quality parameters of the output electron beam based on an imaging result(s) of the one or more samples, and calculating the transmission function based on the quality parameters of the input electron beam and the sets of operation parameters of the electromagnetic lens system for the series of imaging, and the quality parameters of the output electron beam for the imaging result(s) of the one or more samples.

According to some embodiments, determining, based on the quality parameters of the output electron beam, whether calibration of the SEM is required, may include comparing the quality parameters of the output electron beam with preset quality parameters of another output electron beam, and determining, based on a result of the comparison, whether calibration of the SEM is required.

According to some embodiments, calibration of the SEM may include online calibration or offline calibration, and if it is determined, based on the result of the comparison, that calibration of the SEM is required, further determining if the online calibration or the offline calibration is to be performed for the SEM.

According to some embodiments, performing the online calibration for the SEM may include adjusting, when the SEM is in operation (online), at least one operation parameter of the current set of operation parameters of the electromagnetic lens system based on known standard patterns arranged on a surface of a sample.

According to some embodiments, performing the offline calibration for the SEM may include adjusting, when the SEM is not in operation (offline), at least one operation parameter of the set of operation parameters of the electromagnetic lens system based on known standard patterns arranged on a surface of a sample.

According to another embodiment of the inventive concept, an apparatus for monitoring an electron beam condition of an SEM is provided. The SEM includes an electron gun and an electromagnetic lens system. The apparatus includes a first acquiring unit configured to acquire quality parameters of an input electron beam, wherein the input electron beam is provided by the electron gun to the electromagnetic lens system, a second acquiring unit configured to acquire a current set of operation parameters of the electromagnetic lens system, a calculating unit configured to calculate quality parameters of an output electron beam of the electromagnetic lens system based on the quality parameters of the input electron beam acquired by the first acquiring unit and one or more operation parameters of the current set of operation parameters acquired by the second acquiring unit, and a determining unit configured to determine, based on the quality parameters of the output electron beam, whether calibration of the SEM is required.

According to some embodiments, the quality parameters of the input electron beam may include spatial-angular distribution, kinetic energy dispersion, or current amplitude of the input electron beam, and the quality parameters of the output electron beam may include diameter, ovality, or collimation degree of the output electron beam.

According to some embodiments, the first acquiring unit may be configured to retrieve the quality parameters of the input electron beam from a data log of the electron gun, and the second acquiring unit may be configured to retrieve the current set of operation parameters of the electromagnetic lens system from a data log of the electromagnetic lens system.

According to some embodiments, the calculating unit may include a first calculating sub-unit configured to calculate a transmission matrix of the electromagnetic lens system for the input electron beam using the current set of operation parameters acquired by the second acquiring unit and a transmission function of the electromagnetic lens system, and a second calculating sub-unit configured to calculate the quality parameters of the output electron beam based on the quality parameters of the input electron beam acquired by the first acquiring unit and the transmission matrix calculated by the first calculating sub-unit.

According to some embodiments, the transmission function may be a matrix comprising a plurality of elements, and each element may be a function of one or more operation parameters of the set of operation parameters.

According to some embodiments, the determining unit may be configured to compare the quality parameters of the output electron beam with preset quality parameters of another output electron beam, and to determine, based on a result of the comparison, whether calibration of the SEM is required.

According to some embodiments, calibration of the SEM may include online calibration or offline calibration, and if the determining unit determines, based on the result of the comparison, that calibration of the SEM is required, the determining unit may be further configured to determine if the online calibration or offline calibration is to be performed for the SEM based on the result of the comparison.

According to some embodiments, the apparatus may further include an online calibrating unit configured to adjust at least one operation parameter of the current set of operation parameters of the electromagnetic lens system using known standard patterns arranged on a surface of a sample.

According to some other embodiments, an SEM including the apparatus for monitoring the electron beam condition of the SEM according to any of the above embodiments is provided.

The above embodiments of the inventive concept enable the electron beam condition of the SEM to be monitored online, thereby providing an accurate determination of when calibration of the SEM is required, without any loss in SEM scanning productivity.

Further features and advantages of the inventive concept will become apparent with reference to the following detailed description of the different embodiments of the inventive concept.

BRIEF DESCRIPTION OF THE DRAWINGS

The accompanying drawings, which are incorporated in and constitute a part of the specification, illustrate different embodiments of the inventive concept and, together with the description, serve to explain the principles of the inventive concept.

DESCRIPTION OF THE EMBODIMENTS

Figure 1:
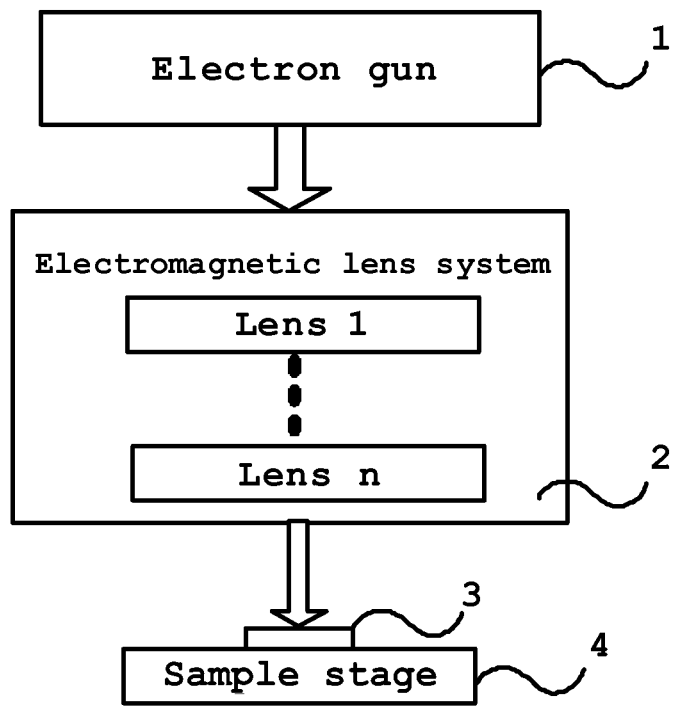
FIG. 1 is a block diagram of an SEM according to an embodiment of the inventive concept.

Various embodiments of the inventive concept will be described in detail with reference to the drawings as follows. It is noted that the relative arrangement of the components and steps, the numerical expressions, and numerical values set forth in these embodiments do not limit the scope of the present disclosure unless specifically stated otherwise.

For the convenience of description, each component in the figures may not be necessarily drawn to scale.

The following description of the different embodiments is illustrative in nature and is in no way intended to limit the inventive concept, its application, or uses.

Techniques, methods, and apparatus known by one of ordinary skill in the relevant art, even if not discussed in detail in the following description, are intended to be part of the specification where appropriate.

In all of the examples illustrated and discussed herein, any specific values should be interpreted to be illustrative only and therefore non-limiting. Thus, other examples of the embodiments may have values different from those of the described embodiments.

Notice that similar reference numerals and letters refer to similar items in the following figures, and thus once an item is defined in one figure, it is possible that it need not be further discussed for following figures.

FIG. 1 is a block diagram of an SEM according to an embodiment of the inventive concept. The SEM can be any electron microscope for scanning (surfaces of) samples, such as the Critical Dimension Scanning Electron Microscope (CD-SEM) used in semiconductor manufacturing processing.

As shown in FIG. 1, the SEM includes an electron gun 1 and an electromagnetic lens system 2. The SEM is configured to generate an electron beam that strikes and scans a surface of a sample 3, thereby imaging the surface of the sample 3. To achieve high SEM imaging quality, the electron beam should preferably have a small diameter and ovality.

Referring to FIG. 1, an electron beam emitted from the electron gun 1 is provided as an input electron beam to the electromagnetic lens system 2. The electromagnetic lens system 2 may include one or more electromagnetic lens for adjusting the input electron beam. For example, the electromagnetic lens system 2 may include a series of lenses. The series of lenses may include an object lens located near an end of the electromagnetic lens system 2 for focusing the input electron beam onto the surface of the sample 3. In other words, after the input electron beam travels through the electromagnetic lens system 2, the input electron beam is focused into an output electron beam that strikes and scans the surface of the sample 3.

In the SEM of FIG. 1, an adjustment operation may be performed on the input electron beam using a set of operation parameters of the electromagnetic lens system 2. The set of operation parameters of the electromagnetic lens system 2 may represent a transmission function between the input electron beam and the output electron beam. The set of operation parameters may include parameters representing positions or angles of various components of the electromagnetic lens system 2.

During normal operation of the SEM, the operation parameters of the electromagnetic lens system 2 may drift (or change) over time and result in a change in the electron beam condition. The drift in the operation parameters may occur even if the operation parameters have not been modified by the SEM user. For example, the drift in the operation parameters may be due to surrounding vibrations and other external disturbances as a result of locating the SEM in a manufacturing facility.

As stated previously, changes in the electron beam condition may be corrected by performing a calibration on the SEM (for example, an offline calibration). In some embodiments, the calibration may include adjusting one or more operation parameters of the electromagnetic lens system 2 to change a condition of the output electron beam. For example, a position of a sample stage 4 may be adjusted to obtain an accurate calibration result, based on which the condition of the output electron beam may be changed.

It will be appreciated that the above descriptions of the electron gun 1 and the electromagnetic lens system 2 are merely illustrative, and one of ordinary skill in the art may employ an electron gun and an electromagnetic lens system in any appropriate configuration as needed.

Figure 2:
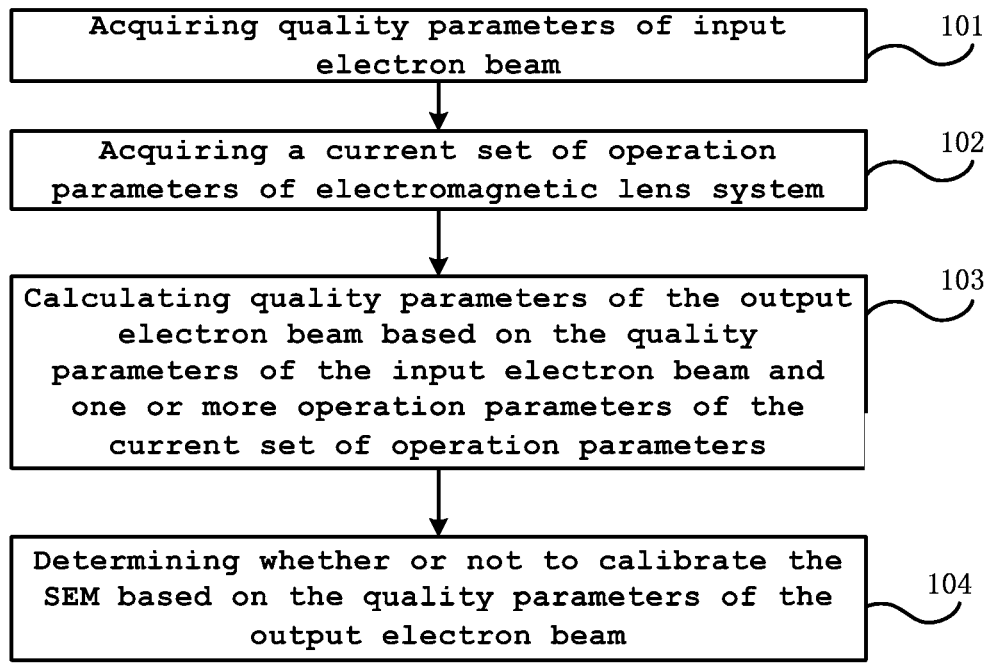
FIG. 2 is a flowchart of a method for monitoring an electron beam condition of an SEM according to an embodiment of the inventive concept.

FIG. 2 is a flowchart of a method for monitoring an electron beam condition of an SEM according to an embodiment of the inventive concept. As shown in FIG. 2, the method for monitoring the electron beam condition of the SEM includes the following steps.

A first acquiring step 101 is performed to acquire quality parameters of the input electron beam. The quality parameters of the input electron beam may include, for example, spatial-angular distribution, kinetic energy dispersion, or current amplitude of the input electron beam. In some embodiments, the quality parameters of the input electron beam may be acquired periodically, or at any given time.

A second acquiring step 102 is performed to acquire a current set of operation parameters of the electromagnetic lens system (for example, electromagnetic lens system 2). In some embodiments, the current set of operation parameters of the electromagnetic lens system may be acquired periodically, or at any given time.

Although FIG. 2 illustrates the performing of the first acquiring step 101 prior to the second acquiring step 102, the steps 101 and 102 may also be performed in reverse order or in parallel. In some embodiments, the first acquiring step 101 and the second acquiring step 102 are independent of each other and not limited by any order. In a preferred embodiment, the first acquiring step 101 and the second acquiring step 102 may be concurrently performed.

Next, a calculating step 103 is performed to calculate quality parameters of the output electron beam, based on the quality parameters of the input electron beam from the first acquiring step 101 and one or more operation parameters of the current set of operation parameters from the second acquiring step 102. The quality parameters of the output electron beam may include, for example, the diameter, ovality, or collimation degree of the output electron beam.

Next, a determining step 104 is performed to determine, based on the quality parameters of the output electron beam, whether calibration of the SEM is required.

In contrast to periodic offline calibrations for the SEM, the method of FIG. 2 enables online (continuous) monitoring of the electron beam condition of the SEM, based on the quality parameters of the output electron beam. As stated previously, periodic offline calibrations may not be sufficient to address any potential deterioration in the electron beam condition occurring in the time interval between offline calibrations. Unlike periodic offline calibrations, online monitoring of the electron beam condition of the SEM (as provided by the method of FIG. 2) may ensure proper electron beam condition during actual operation of the SEM.

Also, as noted previously, unnecessary and frequent offline calibrations may affect SEM scanning throughput and distort a sample benchmark. Unnecessary and frequent offline calibrations may be avoided using the online monitoring method of FIG. 2, since the SEM need not be calibrated when the electron beam condition is determined to be within operating guidelines (for example, as determined by step 104). In contrast to offline calibrations, online monitoring of the electron beam condition may improve SEM scanning productivity and maintain consistency of sample measurement results.

In some embodiments, the quality parameters of the input electron beam may be recorded in a data log of the electron gun 1, and in the first acquiring step 101, the quality parameters of the input electron beam may be retrieved from the data log of the electron gun 1.

In some embodiments, the current set of operation parameters of the electromagnetic lens system 2 may be recorded in a data log of the electromagnetic lens system 2, and in the second acquiring step 102, the current set of operation parameters of the electromagnetic lens system 2 may be retrieved from the data log of the electromagnetic lens system 2.

In some other embodiments, the current set of operation parameters of the electromagnetic lens system 2 may be acquired in other ways. For example, the current set of operation parameters of the electromagnetic lens system 2 may be detected real-time during the operation of the SEM.

In some embodiments, the current set of operation parameters of the electromagnetic lens system 2 may be denoted by $X_1 \sim X_n$ (where n is an integer greater than 1). Table 1 below shows an example of a current set of operation parameters $X_1 \sim X_n$ recorded in a data log of the electromagnetic lens system 2, with $A_1 \sim A_n$ being the respective current values of $X_1 \sim X_n$. For the operation parameters $X_1 \sim X_n$, there may be one or more operation parameters relating to a same lens. For example, as shown in Table 1, $X_1$ and $X_2$ may indicate the respective X-axis inclination and Y-axis inclination of lens 1, with $A_1$ and $A_2$ indicating the respective current values of $X_1$ and $X_2$.

TABLE 1

| Name of operation parameter | Current value of operation parameter | Scope of operation parameter |
| --- | --- | --- |
| X1 | A1 | Retarding |
| X2 | A2 | X-axis inclination of lens 1 |
| X3 | A3 | Y-axis inclination of lens 1 |
| X4 | A4 | X-axis inclination of lens 2 |
| ... | ... | ... |
| Xn | An | ... |

It is readily appreciated that other operation parameters, in addition to those listed in Table 1, may be used to represent the operation condition of electromagnetic lens system 2. For example, in some embodiments, the current set of operation parameters of the electromagnetic lens system 2 may include additional parameters relating to the overall operation condition of the electromagnetic lens system 2.

In some embodiments, the calculating step 103 may be performed as follows. First, a transmission matrix of the electromagnetic lens system 2 for the current input electron beam is calculated based on the current set of operation parameters of the electromagnetic lens system 2 and a transmission function M of the electromagnetic lens system 2. Next, the quality parameters of the output electron beam are calculated based on the transmission matrix of the electromagnetic lens system 2 and the quality parameters of the input electron beam from the first acquiring step 101.

The transmission function M is indicative of a relationship between the input electron beam and the output electron beam, and represents an operation performed by the electromagnetic lens system 2 on the input electron beam. The transmission function M may be a matrix comprising a plurality of elements, and each element in the matrix may be a function of one or more operation parameters from the set of operation parameters of the electromagnetic lens system 2. For example, an element M1 In the matrix may be a function of m operation parameters $X_1 \sim X_m$ from the set of operation parameters $X_1 \sim X_n$ shown in Table 1, with the element M1 denoted by $M1 = f(X_1, \ldots, X_m)$, where m is an integer greater than or equal to 1, but less than or equal to n. In some embodiments, M1 may be a linear combination of $X_1 \sim X_m$, i.e. $M1 = C_1 \times X_1 + C_2 \times X_2 + \ldots + C_m \times X_m$, where $C_1 \sim C_m$ are constants.

Using the current values $A_1 \sim A_n$ of the operation parameters $X_1 \sim X_n$, the value of each element in the transmission function M of the electromagnetic lens system 2 may be calculated. As previously described, the transmission matrix of the electromagnetic lens system 2 for the current input electron beam may be calculated using the transmission function M of the electromagnetic lens system 2 and the current set of operation parameters of the electromagnetic lens system 2. Also, the quality parameters of the output electron beam may be calculated based on the transmission matrix and the quality parameters of the current input electron beam obtained from the first acquiring step 101. As previously described, the quality parameters of the output electron beam may include the diameter, ovality, or collimation degree of the output electron beam.

In some embodiments, the transmission function M may be obtained as follows.

First, a series of SEM imaging is performed for one or more samples having known standard patterns. For example, the series of SEM imaging may be performed for the same patterns on different samples, or for different patterns on different samples. The series of SEM imaging may also be performed for the same or different patterns within each sample. Performing SEM imaging for different patterns on different samples allows the transmission function M to be adapted for different samples. In practice, however, the series of SEM imaging is usually performed for different patterns on a same sample, so as to avoid variations in the SEM environment resulting from frequent replacement of different samples in the SEM.

For each SEM imaging, quality parameters of the input electron beam and a set of operation parameters of the electromagnetic lens system 2 are acquired. Quality parameters of the output electron beam are also obtained based on one or more imaging result of an imaged sample(s).

Next, the transmission function M is derived based on the quality parameters of the input electron beam and the sets of operation parameters of the electromagnetic lens system 2 from the series of SEM imaging, and the quality parameters of the output electron beam from one or more imaging result of the imaged sample(s).

In some embodiments, the determining step 104 may be implemented as follows.

First, the quality parameters of the output electron beam from the calculating step 103 are compared with preset quality parameters of another output electron beam. The preset quality parameters may be predetermined based on SEM imaging needs (for example, the feature sizes to be resolved, high resolution or low resolution imaging, etc.). The preset quality parameters may also serve as a benchmark for measuring the quality parameters of the output electron beam, thereby allowing consistent calibration results to be obtained.

Next, it is determined whether calibration of the SEM is required, based on a result of the comparison between the quality parameters of the output electron beam and the preset quality parameters.

As previously described, the calibration for the SEM may include online calibration (online monitoring) or offline calibration. If calibration of the SEM is required, it may be further determined whether online calibration or offline calibration is to be performed for the SEM based on a comparison result. For example, in some embodiments, calibration of the SEM is required when a difference between the quality parameters of the output electron beam and the preset quality parameters is greater than a first preset threshold. In some embodiments, when the above difference is greater than the first preset threshold but less than a second preset threshold, it may be determined that online calibration is to be performed for the SEM. In some other embodiments, when the above difference is greater than the second preset threshold, it may be determined that offline calibration is to be performed for the SEM.

Figure 3:
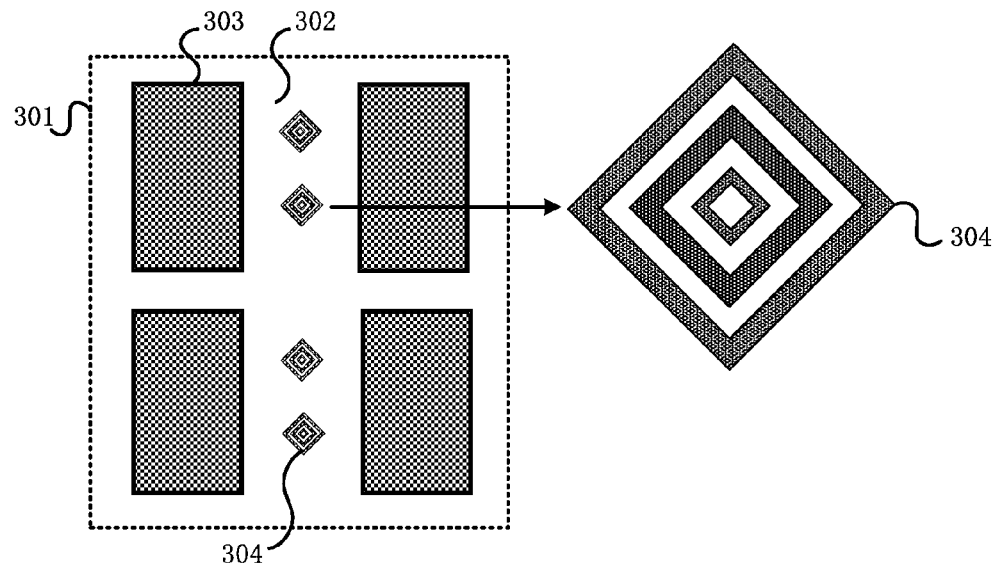
FIG. 3 illustrates a view of a sample having known standard patterns according to an embodiment of the inventive concept.

FIG. 3 illustrates a view of a sample under test having known standard patterns according to an embodiment of the inventive concept. With reference to FIG. 3, the sample is a wafer 301 that is divided by scribe lanes 302 into a plurality of chips 303. A plurality of standard patterns 304 may be arranged within a width of the scribe lanes 302 for calibrating the SEM. The right side of FIG. 3 shows an enlarged view of a standard pattern 304 having a predetermined size, symmetrical shape, and high edge contrast.

An online calibration for the SEM may be performed using the standard patterns 304 while the SEM is still in operation. The online calibration allows at least one operation parameter of the current set of operation parameters of the electromagnetic lens system 2 to be adjusted when the sample is being observed or measured using the SEM. For example, operation parameters such as the mechanical position of the sample stage or the operation voltage of the SEM may be adjusted during the online calibration. As previously described, the online calibration can enhance SEM scanning productivity because it does not require the SEM to be in an offline state during the calibration.

The method for calibrating the electron beam condition of the SEM according to the above-described embodiments of the inventive concept may be performed periodically or at any given time, so as to realize online monitoring of the electron beam condition of the SEM as well as on-demand calibration of the SEM.

Figure 4:
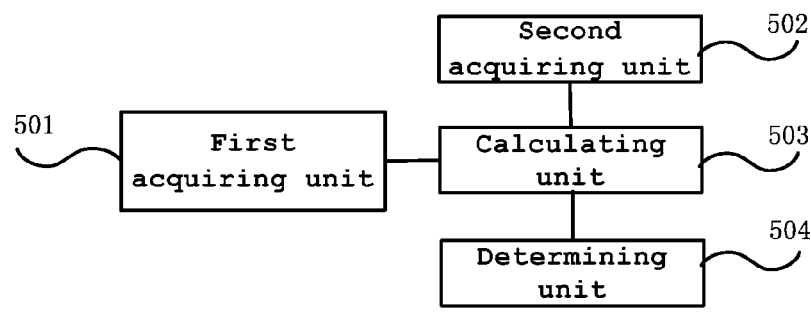
FIG. 4 is a block diagram of an apparatus for monitoring an electron beam condition of an SEM according to an embodiment of the inventive concept.

FIG. 4 illustrates a block diagram of an apparatus for monitoring an electron beam condition of an SEM (for example, the SEM shown in FIG. 1). The apparatus of FIG. 4 may be used to implement a method for monitoring the electron beam condition of the SEM according to different embodiments of the inventive concept. The apparatus and the units therein may be realized by software, hardware, or a combination of both software and hardware. The apparatus may be incorporated into the SEM as part of the SEM. Alternatively, the apparatus may be a separate unit used in conjunction with the SEM.

With reference to FIG. 4, the apparatus for monitoring the electron beam condition of the SEM includes a first acquiring unit 501, a second acquiring unit 502, a calculating unit 503, and a determining unit 504.

The first acquiring unit 501 is configured to acquire quality parameters of the input electron beam. The quality parameters of the input electron beam may include, for example, spatial-angular distribution, kinetic energy dispersion, or current amplitude of the input electron beam. In some embodiments, the quality parameters of the input electron beam may be acquired periodically, or at any given time.

The second acquiring unit 502 is configured to acquire a current set of operation parameters of the electromagnetic lens system 2. In some embodiments, the current set of operation parameters of the electromagnetic lens system 2 may be acquired periodically, or at any given time.

The calculating unit 503 is configured to calculate quality parameters of the output electron beam, based on the quality parameters of the input electron beam acquired by the first acquiring unit 501 and one or more operation parameters of the current set of operation parameters acquired by the second acquiring unit 502. The set of operation parameters may include parameters representing positions or angles of various components of the electromagnetic lens system 2. The quality parameters of the output electron beam may include a diameter, ovality, or collimation degree of the output electron beam.

The determining unit 504 is configured to determine, based on the quality parameters of the output electron beam, whether calibration of the SEM is required.

In some embodiments, the quality parameters of the input electron beam may be recorded in a data log of the electron gun 1, and the first acquiring unit 501 is configured to retrieve the quality parameters of the input electron beam from the data log of the electron gun 1.

In some embodiments, the current set of operation parameters of the electromagnetic lens system 2 may be recorded in a data log of the electromagnetic lens system 2, and the second acquiring unit 502 is configured to retrieve the current set of operation parameters of the electromagnetic lens system 2 from the data log of the electromagnetic lens system 2.

In some embodiments, the determining unit 504 compares the quality parameters of the output electron beam with preset quality parameters of another output electron beam. As previously described, the preset quality parameters may be predetermined based on SEM imaging needs (for example, the feature sizes to be resolved, high resolution or low resolution imaging, etc.). Based on a result of the above comparison, the determining unit 504 determines whether calibration of the SEM is required.

As previously described, the calibration for the SEM may include online calibration (online monitoring) or offline calibration. If calibration of the SEM is required, the determining unit 504 may further determine whether online calibration or offline calibration is to be performed for the SEM based on a comparison result. For example, in some embodiments, the determining unit 504 may determine that calibration of the SEM is required when a difference between the quality parameters of the output electron beam and the preset quality parameters is greater than a first preset threshold. In some embodiments, the determining unit 504 may determine that online calibration is to be performed for the SEM when the difference is greater than the first preset threshold but less than a second preset threshold. In some other embodiments, the determining unit 504 may determine that offline calibration is to be performed for the SEM when the difference is greater than the second preset threshold.

As previously described, an online calibration for the SEM may be performed using known standard patterns that are arranged on a surface of the sample under test. In some embodiments, the apparatus of FIG. 4 may further include an online calibration unit configured to adjust one or more operation parameters of the current set of operation parameters of the electromagnetic lens system 2 when a sample is under observation or measurement in the SEM. By using the known standard patterns arranged on the sample, online calibrations may be performed for the SEM in real-time.

Figure 5:
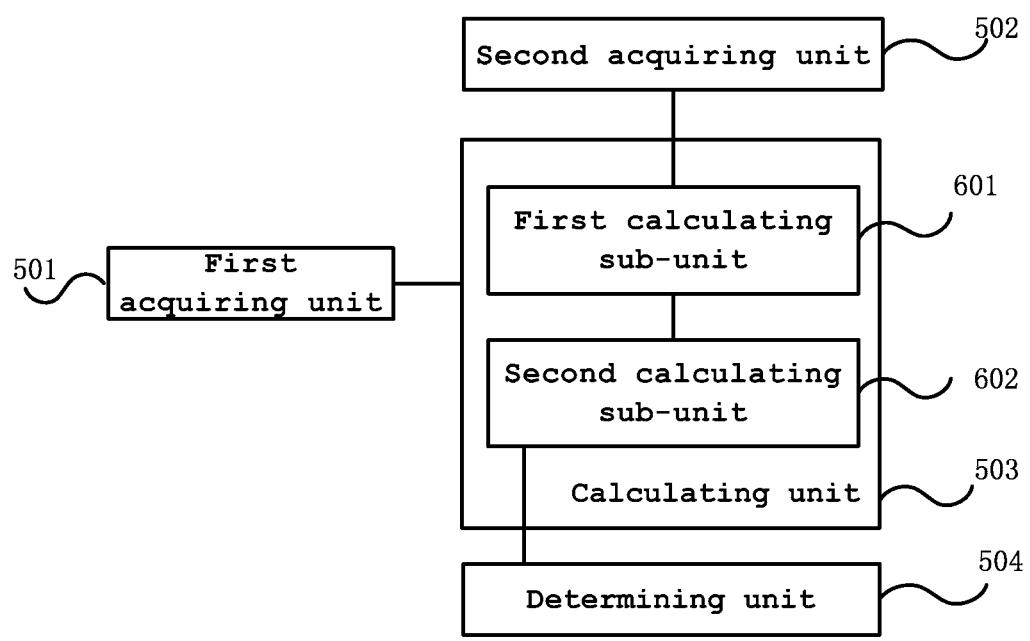
FIG. 5 is a block diagram of an apparatus for monitoring an electron beam condition of an SEM according to another embodiment of the inventive concept.

FIG. 5 illustrates a block diagram of an apparatus for monitoring the electron beam condition of an SEM according to another embodiment of the inventive concept. As shown in FIG. 5, the calculating unit 503 includes a first calculating sub-unit 601 and a second calculating sub-unit 602.

The first calculating sub-unit 601 is configured to calculate a transmission matrix of the electromagnetic lens system 2 for the current input electron beam, using the current set of operation parameters of the electromagnetic lens system 2 acquired by the second acquiring unit 502 and a transmission function M of the electromagnetic lens system 2.

As previously described, the transmission function M may be a matrix comprising a plurality of elements, and each element in the matrix may be a function of one or more operation parameters of the set of operation parameters of the electromagnetic lens system 2. Using the current values (for example, A1~An) of the operation parameters (for example, X1~Xn) of the electromagnetic lens system 2, the value of each element in the transmission function M of the electromagnetic lens system 2 can be calculated.

The second calculating sub-unit 602 is configured to calculate the quality parameters of the output electron beam, based on the quality parameters of the input electron beam acquired by the first acquiring unit 501 and the transmission matrix calculated by the first calculating sub-unit 601.

The described method and apparatus for monitoring the electron beam condition of the SEM according to different embodiments of the inventive concept may be implemented in various ways. For example, the method and apparatus may be implemented by software, hardware, firmware, or any combinations thereof. The above sequence of steps for the above methods is merely illustrative, and the present disclosure is not limited thereto unless specifically stated otherwise. In addition, in some embodiments, the inventive concept can be implemented as programs recorded on a recording medium, and these programs can include machine readable instructions for implementing the method of the inventive concept. Thus, the inventive concept also includes in part a recording medium that stores programs for implementing the method according to the inventive concept.

One of ordinary skill in the art will readily appreciate that all or some of the steps for realizing the above embodiments may be implemented by hardware associated with programs or instructions. The programs can be stored in a computer readable storage medium and can perform the steps of the above method embodiments when executed. Moreover, the above-described storage medium includes various media that can store program codes, such as ROM, RAM, magnetic disk, optical disk, or other similar recording media.

The descriptions of the inventive concept are illustrative and descriptive but not exclusive, and are not intended to limit the inventive concept. The embodiments are selected and described such that one of ordinary skill in the art will be able to understand the inventive concept and modify the embodiments to meet specific uses.

What is claimed is:

1. A method for monitoring an electron beam condition of a scanning electron microscope (SEM), the SEM comprising an electron gun and an electromagnetic lens system, the method comprising:
   acquiring quality parameters of an input electron beam, wherein the input electron beam is provided by the electron gun to the electromagnetic lens system;
   acquiring a current set of operation parameters of the electromagnetic lens system;
   calculating quality parameters of an output electron beam of the electromagnetic lens system, based on the quality parameters of the input electron beam and one or more operation parameters of the current set of operation parameters; and
   determining, based on the quality parameters of the output electron beam, whether calibration of the SEM is required.

2. The method of claim 1, wherein the quality parameters of the input electron beam include spatial-angular distribution, kinetic energy dispersion, or current amplitude of the input electron beam; and
   the quality parameters of the output electron beam include a diameter, ovality, or collimation degree of the output electron beam.

3. The method of claim 1, wherein acquiring the quality parameters of the input electron beam comprises:
   retrieving the quality parameters of the input electron beam from a data log of the electron gun.

4. The method of claim 1, wherein acquiring the current set of operation parameters of the electromagnetic lens system comprises:
   retrieving the current set of operation parameters of the electromagnetic lens system from a data log of the electromagnetic lens system.

5. The method of claim 1, wherein calculating the quality parameters of the output electron beam of the electromagnetic lens system comprises:
   calculating a transmission matrix of the electromagnetic lens system for the input electron beam, using the current set of operation parameters and a transmission function of the electromagnetic lens system; and
   calculating the quality parameters of the output electron beam based on the quality parameters of the input electron beam and the transmission matrix.

6. The method of claim 5, wherein the transmission function is a matrix comprising a plurality of elements, and each element is a function of one or more operation parameters of the current set of operation parameters.

7. The method of claim 6, wherein the transmission function is calculated by:
   performing a plurality of imaging for one or more samples having known standard patterns using the SEM;
   acquiring quality parameters of the input electron beam and a set of operation parameters of the electromagnetic lens system for each imaging;
   obtaining quality parameters of the output electron beam based on an imaging result(s) of the one or more samples; and
   calculating the transmission function based on the quality parameters of the input electron beam and the sets of operation parameters of the electromagnetic lens system for the series of imaging, and the quality parameters of the output electron beam for the imaging result(s) of the one or more samples.

8. The method of claim 1, wherein determining, based on the quality parameters of the output electron beam, whether calibration of the SEM is required comprises:
comparing the quality parameters of the output electron beam with preset quality parameters of another output electron beam, and
determining, based on a result of the comparison, whether calibration of the SEM is required.

9. The method of claim 8, wherein calibration of the SEM includes online calibration or offline calibration; and
if it is determined, based on the result of the comparison, that calibration of the SEM is required:
further determining if the online calibration or the offline calibration is to be performed for the SEM.

10. The method of claim 9, wherein performing the online calibration for the SEM includes:
adjusting, when the SEM is in operation (online), at least one operation parameter of the current set of operation parameters of the electromagnetic lens system based on known standard patterns arranged on a surface of a sample.

11. The method of claim 9, wherein performing the offline calibration for the SEM includes:
adjusting, when the SEM is not in operation (offline), at least one operation parameter of the current set of operation parameters of the electromagnetic lens system based on known standard patterns arranged on a surface of a sample.

12. An apparatus for monitoring an electron beam condition of a scanning electron microscope (SEM), the SEM comprising an electron gun and an electromagnetic lens system, the apparatus comprising:
a first acquiring unit configured to acquire quality parameters of an input electron beam, wherein the input electron beam is provided by the electron gun to the electromagnetic lens system;
a second acquiring unit configured to acquire a current set of operation parameters of the electromagnetic lens system;
a calculating unit configured to calculate quality parameters of an output electron beam of the electromagnetic lens system, based on the quality parameters of the input electron beam acquired by the first acquiring unit and one or more operation parameters of the current set of operation parameters acquired by the second acquiring unit; and
a determining unit configured to determine, based on the quality parameters of the output electron beam, whether calibration of the SEM is required.

13. The apparatus of claim 12, wherein the quality parameters of the input electron beam include spatial-angular distribution, kinetic energy dispersion, or current amplitude of the input electron beam; and
the quality parameters of the output electron beam include diameter, ovality, or collimation degree of the output electron beam.

14. The apparatus of claim 12, wherein the first acquiring unit is configured to retrieve the quality parameters of the input electron beam from a data log of the electron gun; and
the second acquiring unit is configured to retrieve the current set of operation parameters of the electromagnetic lens system from a data log of the electromagnetic lens system.

15. The apparatus of claim 12, wherein the calculating unit comprises:
a first calculating sub-unit configured to calculate a transmission matrix of the electromagnetic lens system for the input electron beam using the current set of operation parameters acquired by the second acquiring unit and a transmission function of the electromagnetic lens system; and
a second calculating sub-unit configured to calculate the quality parameters of the output electron beam based on the quality parameters of the input electron beam acquired by the first acquiring unit and the transmission matrix calculated by the first calculating sub-unit.

16. The apparatus of claim 15, wherein the transmission function is a matrix comprising a plurality of elements, and each element is a function of one or more operation parameters of the current set of operation parameters.

17. The apparatus of claim 12, wherein the determining unit is configured to compare the quality parameters of the output electron beam with preset quality parameters of another output electron beam, and to determine, based on a result of the comparison, whether calibration of the SEM is required.

18. The apparatus of claim 17, wherein calibration of the SEM includes online calibration or offline calibration; and
if the determining unit determines, based on the result of the comparison, that calibration of the SEM is required:
the determining unit is further configured to determine if the online calibration or offline calibration is to be performed for the SEM based on the result of the comparison.

19. The apparatus of claim 18 further comprising:
an online calibrating unit configured to adjust at least one operation parameter of the current set of operation parameters of the electromagnetic lens system based on known standard patterns arranged on a surface of a sample.

20. A scanning electron microscope (SEM) comprising the apparatus for monitoring the electron beam condition of the SEM according to claim 12.

* * * * *